(12) United States Patent
Lee (10) Patent No.: US 7,777,219 B2
(45) Date of Patent: Aug. 17, 2010

(54) DUAL PANEL TYPE ORGANIC ELECTROLUMINESCENT DISPLAY DEVICE

(75) Inventor: Jong-Hwa Lee, Gyeonggi-do (KR)

(73) Assignee: LG. Display Co., Ltd., Seoul (KR)

( * ) Notice: Subject to any disclaimer, the term of this patent is extended or adjusted under 35 U.S.C. 154(b) by 453 days.

(21) Appl. No.: 11/639,861

(22) Filed: Dec. 15, 2006

(65) Prior Publication Data

US 2007/0158649 A1    Jul. 12, 2007

(30) Foreign Application Priority Data

Dec. 30, 2005   (KR) .................... 10-2005-0135919

(51) Int. Cl.
*H01L 35/24* (2006.01)
*H01L 51/00* (2006.01)

(52) U.S. Cl. .............. 257/40; 257/59; 257/72; 257/E51.001; 257/E33.001; 257/E27.001; 349/56

(58) Field of Classification Search ............ 257/59; 349/43, 56
See application file for complete search history.

(56) References Cited

U.S. PATENT DOCUMENTS

| | | | |
|---|---|---|---|
| 7,067,983 B2 * | 6/2006 | Ozawa et al. ......... 315/169.1 |
| 7,142,781 B2 * | 11/2006 | Koyama et al. .......... 396/109 |
| 7,157,847 B2 * | 1/2007 | Kawachi et al. .......... 313/495 |
| 2004/0031959 A1 * | 2/2004 | Park et al. .................. 257/40 |
| 2004/0080262 A1 * | 4/2004 | Park et al. ................. 313/498 |
| 2004/0145306 A1 * | 7/2004 | Park et al. ................. 313/506 |
| 2004/0195959 A1 * | 10/2004 | Park et al. ................. 313/500 |
| 2005/0127825 A1 * | 6/2005 | Bae et al. .................. 313/504 |
| 2005/0139839 A1 * | 6/2005 | Park .......................... 257/79 |
| 2005/0140285 A1 * | 6/2005 | Park et al. ................. 313/506 |

FOREIGN PATENT DOCUMENTS

CN    1438521 A    8/2003

OTHER PUBLICATIONS

Office Action issued in corresponding Chinese Patent Application No. 200610169006.7; issued Oct. 10, 2008.

* cited by examiner

*Primary Examiner*—Kenneth A Parker
*Assistant Examiner*—Anthony Ho
(74) *Attorney, Agent, or Firm*—Brinks Hofer Gilson & Lione (57) ABSTRACT

A dual panel type organic electroluminescent display device includes first and second substrates and a plurality of pixel regions and a plurality of power supply terminals at upper and lower sides of the plurality of pixel regions thereon, and further includes a plurality of dummy pixel regions each having substantially the same structure as each pixel region in the plurality of power supply terminals.

11 Claims, 6 Drawing Sheets

Related Art

FIG. 3

Related Art

DUAL PANEL TYPE ORGANIC ELECTROLUMINESCENT DISPLAY DEVICE

The present application claims the benefit of Korean Patent Application No. 2005-0135919 filed in Korea on Dec. 30, 2005, which is hereby incorporated by reference.

BACKGROUND

1. Technical Field

The present invention relates to an organic electroluminescent display (OELD) device, more particularly, to a dual panel type OELD device and a method of fabricating the same.

2. Related Art

An OELD device of new flat panel display devices is a self-emitting type. The OELD device has excellent characteristics of a view angel, a contrast ratio and so on. Also, since the OELD device does not require a backlight assembly, the OELD device has low weight and low power consumption. Moreover, the OELD device has advantages of a high response rate, a low production cost and so on.

Figure 1:
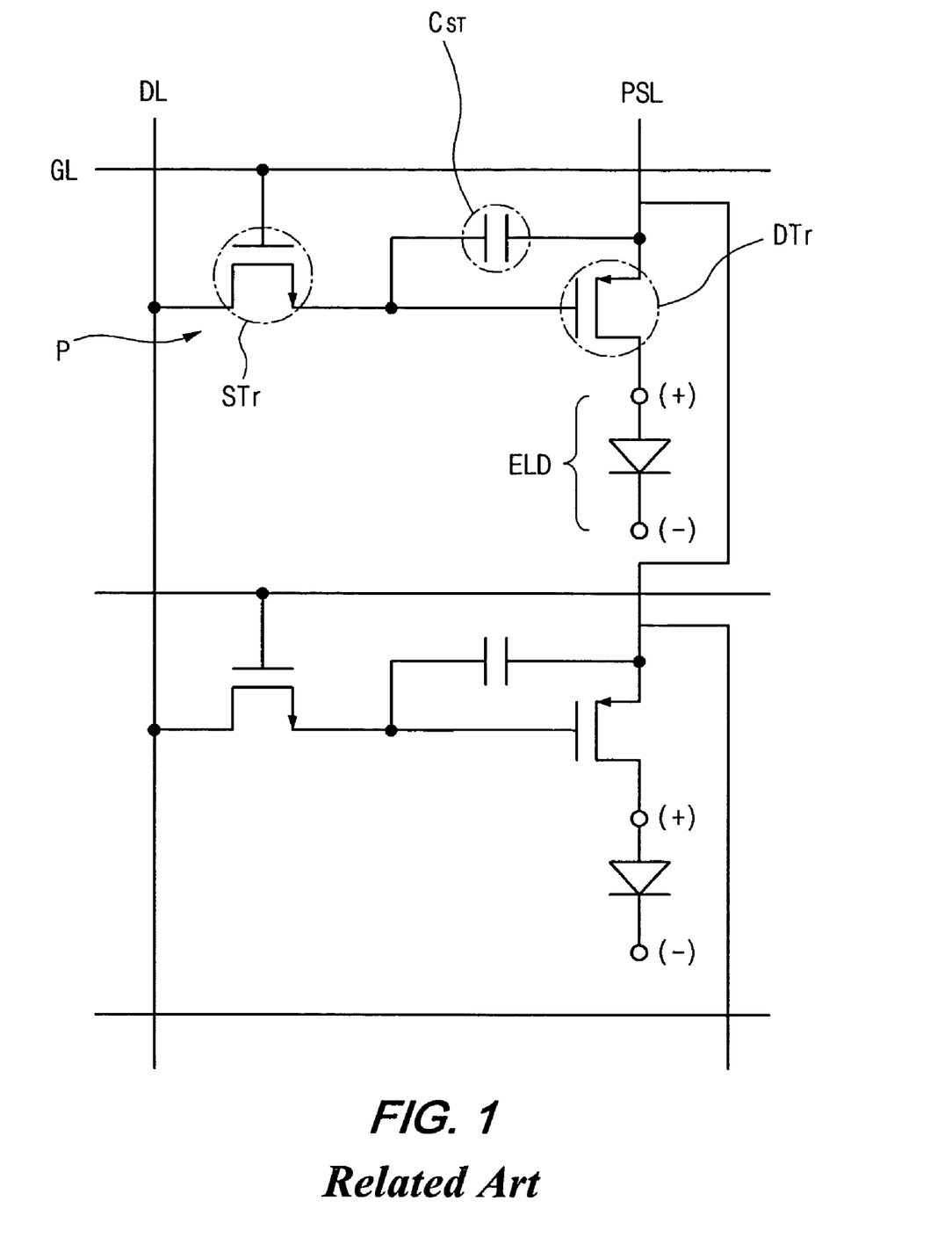
FIG. 1 is a circuit diagram showing a pixel region of the OELD device according to the related art.

FIG. 1 is a circuit diagram showing a pixel region of the OELD device according to the related art. As shown in FIG. 1, a gate line "GL", a data line "DL", a power supply line "PSL", a switching thin film transistor (TFT) "STr", a storage capacitor "Cst", a driving TFT "DTr", and an organic electroluminescent diode "ELD" are formed in the pixel region "P". The gate line "GL" and the data line "DL" cross each other such that the pixel region "P" is defined, and the power supply line "PSL" is formed to be parallel to the data line "DL". The switching TFT "STr" is formed at crossing portion of the gate and data line "GL" and "DL", and the storage capacitor "Cst" is also formed with connected to the switching TFT "STr" and the power supply line "PSL". The driving TFT "DTr" is connected to the storage capacitor "Cst" and the power supply line "PSL", and the organic electroluminescent diode "ELD" is connected to the driving TFT "DTr".

The OELD device emits light by injecting electrons from a cathode and holes from an anode into an emission layer, combining the electrons with the holes, generating an exciton, and transitioning the exciton from an excited state to a ground state. The above-mentioned OELD device including an array device having the switching TFT "STr" and the driving TFT "DTr" and the organic electroluminescent diode "ELD" in a same substrate. The OELD device is fabricated by attaching a first substrate including the array device and the electroluminescent diode "ELD" with a second substrate for encapsulation. However, since the OELD device has a production yield determined by the production yield of the array device and the production yield of the electroluminescent diode "ELD", the production yield of OELD device is decreased. Accordingly, to resolve these problems, a dual panel type OELD device has been suggested. The dual panel type OELD device is fabricated by attaching a first substrate including the array substrate and a second substrate including the organic electroluminescent diode "ELD".

Figure 2:
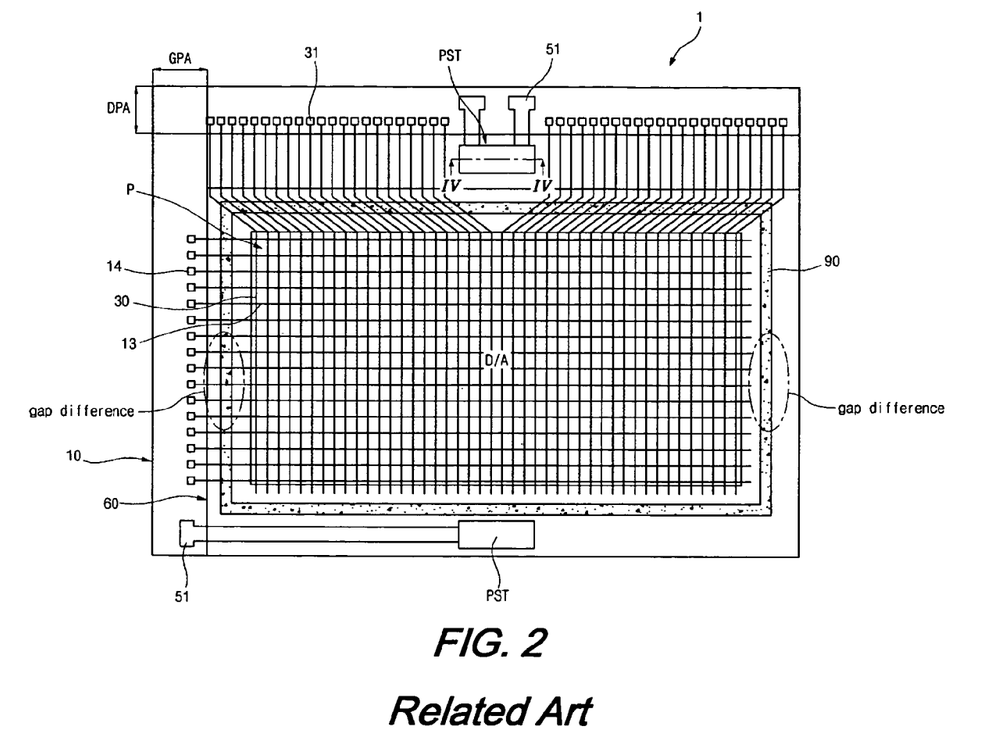
FIG. 2 is a plan view of a dual panel type OELD device according to the related art.
Figure 3:
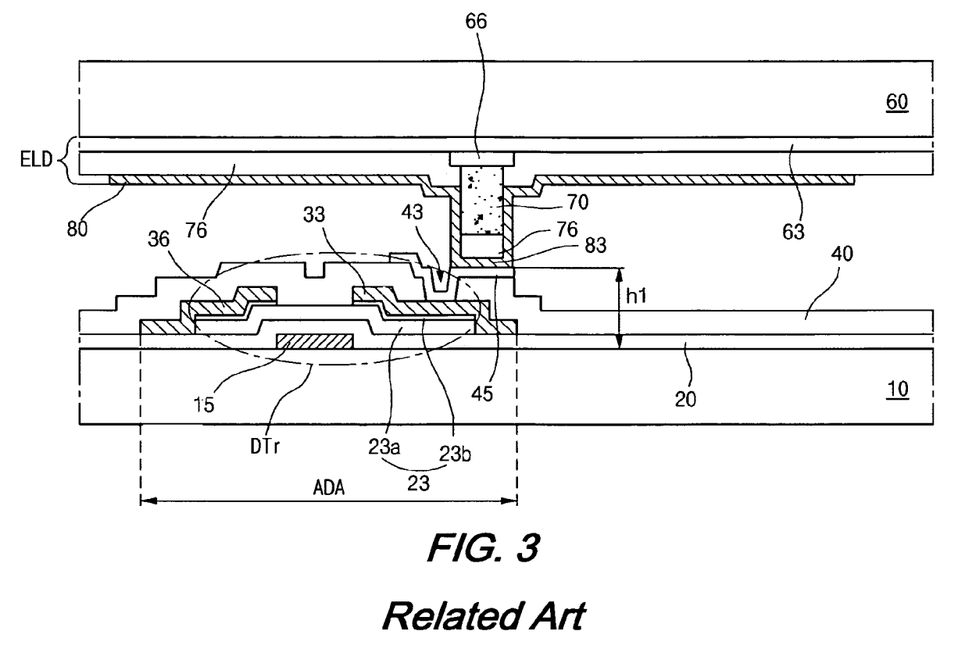
FIG. 3 is a cross-sectional view showing a pixel region of the dual panel type OELD device.
Figure 4:
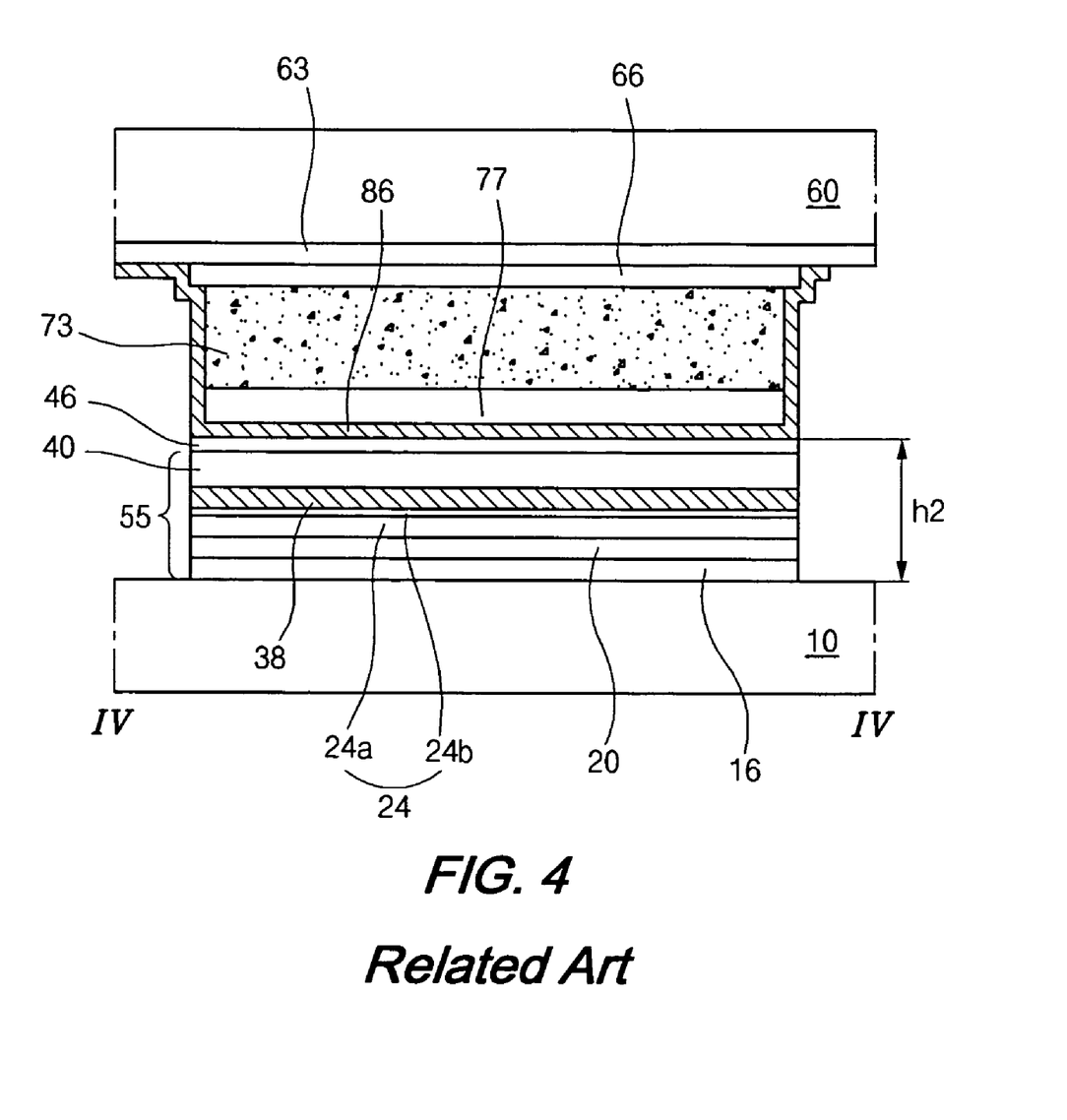
FIG. 4 is a cross-section view showing a power supply terminal taken along the line IV-IV of FIG. 2.

FIG. 2 is a plan view of a dual panel type OELD device according to the related art, FIG. 3 is a cross-sectional view showing a pixel region of the dual panel type OELD device, and FIG. 4 is a cross-section view showing a power supply terminal taken along the line IV-IV of FIG. 2.

As shown in FIG. 2, the dual panel type OELD device 1 according to the related art includes a first substrate 10 and a second substrate 60. A display area "D/A" having a plurality of pixel regions "P" and a non-display region (not numbered) having a gate pad area "GPA" and a data pad area "DPA" at a periphery of the display area "DA" are defined in the first substrate 10. In the display region "D/A", a plurality of gate lines 13 and a plurality of data lines 30, are formed and cross each other to define the plurality of pixel regions "P". The gate line 13 extends to the gate pad area "GPA" such that an end of the gate line 13 is connected to a gate pad 14 in the gate pad area "GPA", and the data line 30 extends to the data pad area "DPA" such that an end of the data line 30 is connected to a data pad 31 in the data pad area "DPA". Though not shown in FIG. 2, the first substrate 10 includes the switching TFT "STr", the driving TFT "DTr", and additional components, and the second substrate 60 includes the organic electroluminescent diode "ELD".

Furthermore, a seal pattern 90 is formed on one of the first and second substrates 10 and 60 to attach the first and second substrate 10 and 60. A power supply terminal "PST" is formed on upper side and lower side of the display area "DA", and a power supply pad 51 extends from the power supply terminal "PST" and is formed in the gate pad area "GPA" and the data pad area "DPA".

As shown in FIG. 3, the first substrate 10 and the second substrate 60 face each other and are separated from each other. The driving TFT "DTr" and the switching TFT "STr" (shown in FIG. 1) are formed in an array device area "ADA" of each pixel region "P" (shown in FIG. 2). The driving TFT "DTr" includes a gate electrode 15 on the first substrate 10, a gate insulating layer 20 on the gate electrode 15, a semiconductor layer 23 on the gate insulating layer 20, source and drain electrodes 33 and 36 separated from each other on the semiconductor layer 23, and a passivation layer 40 on the source and drain electrodes 33 and 36. A first connection electrode 45 is formed on the passivation layer 40 and contacts the source electrode 33 through a contact hole 43 of the passivation layer 40.

And the second substrate 60 includes a first electrode 63, a buffer pattern 66, a first spacer 70, an organic luminescent layer 76, a second electrode 80, and a second connection electrode 83. The first electrode 63 is formed on a side facing the first substrate 10, and the buffer pattern 66 is formed on the first electrode 10 at boundary of the plurality of pixel region "P" (of FIG. 2). The first spacer 70 is formed on the buffer pattern 66, and the first spacer 70 and the buffer pattern 66 correspond to the first connection electrode 45 of the first substrate 10. And the organic luminescent layer 76 and the second electrode 80 are sequentially formed on the first electrode 63 in each pixel region "P" (of FIG. 2). The first electrode 63, the second electrode 80 and the organic luminescent layer 76 interposed therebetween compose the organic electroluminescent diode "ELD". The second connection electrode 83 extends from the second electrode 80 and covers the first spacer 70. When the organic luminescent layer 76 is also formed on the first spacer 70 as in FIG. 3, the second connection electrode 83 covers the organic luminescent layer 76. The second connection electrode 83 contacts the first connection electrode 45 on the first substrate 10 such that the source electrode 33 is electrically connected to the second electrode 80 through the first and second connection electrodes 45 and 83.

FIG. 4 shows a laminated structure of the power supply terminal. As shown in FIG. 4 with FIG. 3, the power supply terminal has the same laminated structure as the driving TFT "DTr" in the pixel region "P". More particularly, a first metal pattern 16, the gate insulating layer 20, a semiconductor pattern 24, a second metal pattern 38, the passivation layer 40, and a third metal pattern 46 are formed on the first substrate 10. The first metal pattern 16 is formed of a same process as the process of forming the gate electrode 15 and has a same height as the gate electrode 15. The gate insulating layer 20 is formed on the first metal pattern 16. The semiconductor pattern 24 is formed of a same process as the process of forming the semiconductor layer 23 on the gate insulating layer 20 and has a same height as the semiconductor layer 23. The second metal pattern 38 is formed of a same process as the process of forming the source and drain electrodes 33 and 36 on the semiconductor pattern 24 and has a same height as the source and drain electrodes 33 and 36. The passivation layer 40 is formed on the second metal pattern 38. The third metal pattern 46 is formed of a same process as the process of forming the first connection electrode 45 in the area device area "ADA".

A laminated structure, which is same as the structure of the second substrate 60 in the array device area "ADA", is formed on the second substrate 60 in the power supply terminal "PST" (shown in FIG. 2). The first electrode 63, the buffer pattern 66, a second spacer 73, an organic luminescent pattern 77, and a third connection electrode 86 are sequentially formed on the second substrate 60. The first electrode 63 is formed on the side facing the first substrate 10, and the buffer pattern 66 and the second spacer 73 is formed on center of the first electrode 63. The organic luminescent pattern 77 is formed on the second spacer 73, and the third connection electrode is formed on the first electrode 63 and covers the second spacer 73 and the organic luminescent pattern 77. The third connection electrode 86 contacts the third metal pattern 46 on the first substrate 10.

An order of laminated layers on the first and second substrate 10 and 60 in the array device area "ADA" of the pixel region "P" and the power supply terminal "PST" is described above. However, since the gate electrode in the array device area "ADA" has a patterned shape and a smaller size than the first metal pattern 16 in the power supply terminal "PST", the gate insulating layer 20 in the array device area "ADA" has a step difference. However, since laminated layers and patterns on the first substrate in the power supply terminal "PSP" have the same shape, there is no step difference. Because of the step difference, the first connection electrode 45 and the third metal pattern 46 have different heights from the first substrate 10. A second height h2 (shown in FIG. 4) of the third metal pattern 46 from the first substrate 10 is greater than a first height h1 (shown in FIG. 3) of the third connection electrode 45, and thus the gap between the first and second substrates 10 and 60 in pixel region P is different from the gap between the first and second substrates 10 and 60 in power supply terminal "PST". Moreover, the power supply terminal "PSP" has a greater size than several ten times or several hundred times than each pixel region "P". Accordingly, both ends of the OELD device 1 have a problem of gap size differences, and the organic electroluminescent diode may not contact the driving TFT.

SUMMARY

Accordingly, the present invention is directed to an organic electroluminescent device and a method of fabricating the same that substantially obviate one or more of the problems due to limitations and disadvantages of the related art.

In accordance with the present invention, as embodied and broadly described herein, a dual panel type organic electroluminescent display device includes first and second substrates, and a plurality of pixel regions and a plurality of power supply terminals at upper and lower sides of the plurality of pixel regions, where the display further includes a plurality of dummy pixel regions in the plurality of power supply terminals each having substantially the same structure as the pixel regions.

In another aspect of the present invention, a method of fabricating a dual panel type organic electroluminescent display device including first and second substrates having a plurality of pixel regions and a plurality of power supply terminals includes forming a driving TFT in each pixel region of the first substrate and a dummy TFT in each dummy pixel region of the plurality of power supply terminals, wherein the dummy TFT has substantially a same structure as the driving TFT, and forming a first connection electrode contacting the driving TFT and a second connection electrode contacting the dummy TFT, wherein the first and second connection electrodes include a transparent conductive material.

In yet another aspect of the present invention, a first substrate has a plurality of pixel regions thereon and power supply terminals adjacent the plurality of pixel regions. Each of the plurality of pixel regions is characterized by a first step height relative to the first substrate. A plurality of dummy pixel regions reside in the power supply terminals, and each of the plurality of dummy pixel regions is characterized by a second step height relative to the first substrate. The first step height is substantially equal to the second step height.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION

Reference will now be made in detail to the preferred embodiments, examples of which are illustrated in the accompanying drawings.

Figure 5:
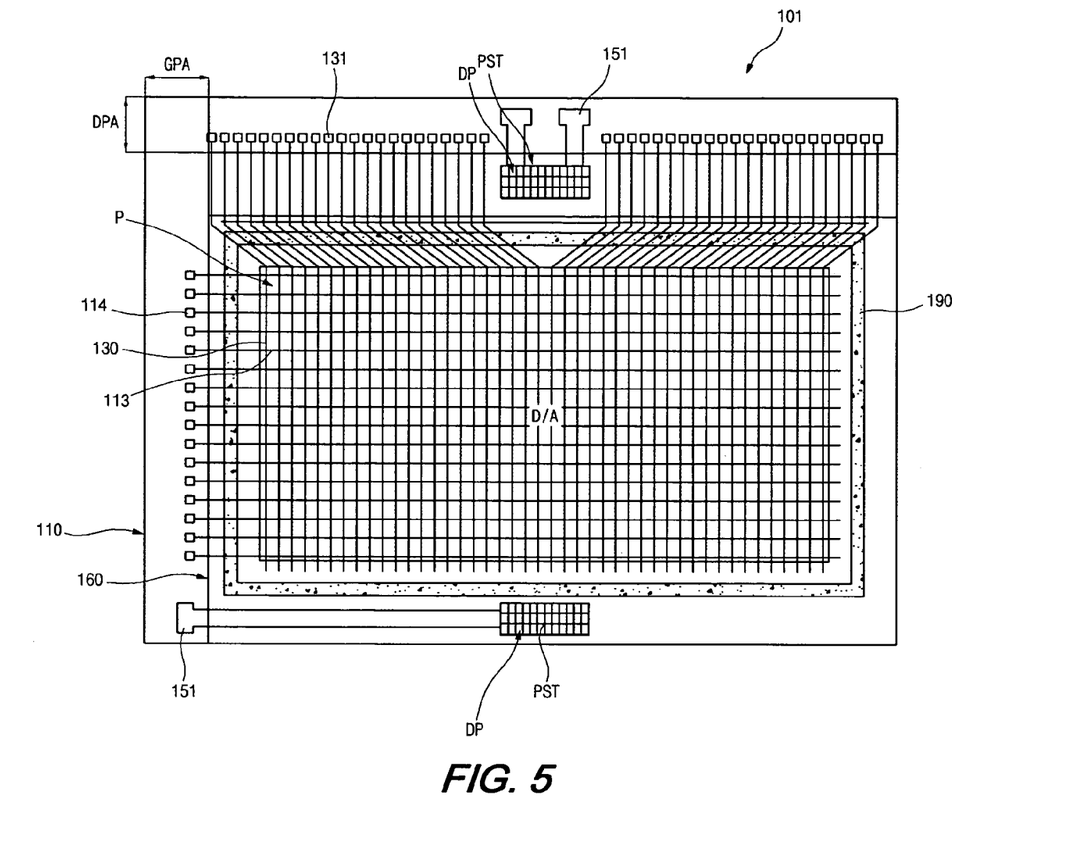
FIG. 5 is a plan view of a dual panel type OELD device according to an aspect of the present invention.

FIG. 5 is a plan view of a dual panel type OELD device according to an aspect of the present invention. As shown in FIG. 5, the dual panel type OELD device 101 including a first substrate 110 and a second substrate 160 facing each other and being spaced apart from each other. The first substrate 110 has a display area "DA", a gate pad area "GPA", a data pad area "DPA", and power supply terminals "PST". The display area "DA" is formed at center of the first substrate 110, and the gate pad area "GPA" may be formed at a left side of the first substrate 110. The data pad area "DPA" may be formed at an upper side of the first substrate 110, and the power supply terminals "PST" may be formed at upper and lower sides of the first substrate 110. A plurality of gate lines 113 and a plurality of data lines 130 are formed in the display area "DA". The plurality of gate lines 113 and the plurality of data lines 130 cross each other to define a plurality of pixel region "P" in the display area "DA". Each gate line 113 extends to the gate pad area "GPA" such that the each gate line 113 is connected to a gate pad electrode 114 in the gate pad area "GPA". Each data line 130 extends to the data pad area "DPA" such that the each data line 130 is connected to a data pad electrode 131 in the gate pad area "GPA". A seal pattern 190 surrounding the display region "DA" is formed such that the first and second substrates are attached to each other. Power supply pads 151, which is connected to the power supply terminals "PST", are formed in the gate pad area "GPA" and the data pad area "DPA".

Though not shown in FIG. 5, a switching TFT and a driving TFT are formed in the each pixel region "P" on the first substrate 110. The switching TFT is connected to the gate and data lines 113 and 130, and a driving TFT is connected to the switching TFT. An organic electroluminescent diode, which has a laminated structure of a first electrode, an organic luminescent layer and a second electrode, is formed on the second substrate 160. The second electrode of the organic electroluminescent diode is electrically connected to the driving TFT of the first substrate 110. A plurality of dummy pixel region "DP" are formed in the power supply terminals "PST", and a dummy TFT is formed in each dummy pixel region "DP". Since the dummy TFT has substantially a same structure as the driving TFT or the switching TFT and substantially a same height from the first substrate 110 as a height of driving TFT or the switching TFT from the first substrate 110, the above-mentioned problem that the gap between the first and second substrates is different becomes resolved.

Figure 6:
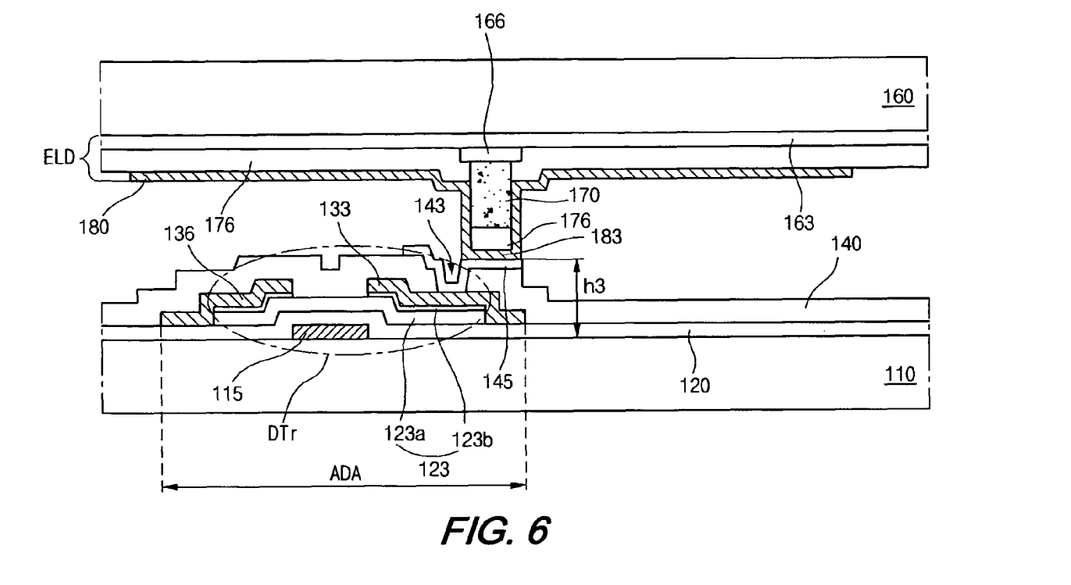
FIG. 6 is a cross-sectional view showing a driving TFT in a pixel region of dual panel type OELD device according to an aspect of the present invention.
Figure 7:
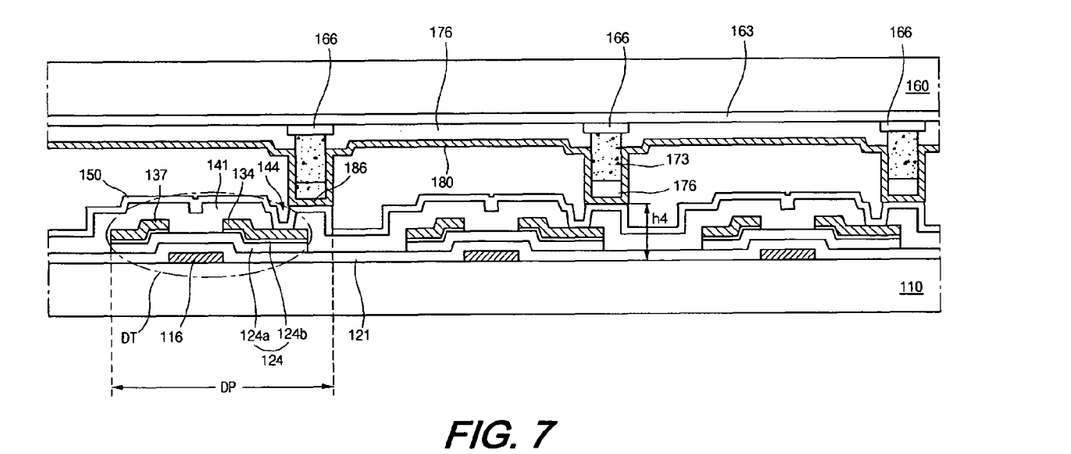
FIG. 7 is a cross-sectional view showing a power supply terminal of dual panel type OELD device according to an aspect of the present invention.

FIG. 6 is a cross-sectional view showing a driving TFT in a pixel region of dual panel type OELD device according to the present invention, and FIG. 7 is a cross-sectional view showing a power supply terminal of dual panel type OELD device according to the present invention. First, an array device area "ADA" and the dummy pixel region "DP" are defined on the first and second substrate 110 and 160. In array device area "ADA", a gate electrode 115 is formed on the first substrate 110, and a gate insulating layer 120 is formed on the gate electrode 115. Since the gate electrode 115 has a patterned shape, the gate insulating layer 120 has a step difference. A semiconductor layer 123 having an active layer 123a and an ohmic contact layer 123b is formed on the gate insulating layer 120, and the ohmic contact layer 123b on the active layer 123a expose a center of the active layer 123a. Since the semiconductor layer 123 is formed on the gate insulating layer 120, the semiconductor layer 123 has a step difference. A source electrode 133 and a drain electrode 136 are formed on the semiconductor layer 123. The source electrode 133 and the drain electrode 136 are also separated from each other such that the active layer 123a is exposed through the ohmic contact layer 123b and between the source and drain electrodes 133 and 136. The source and drain electrodes 133 and 136 also has a step difference. A passivation layer 140 is formed on the source and drain electrodes 133 and 136. The passivation layer 140 has a first contact hole 143 that exposes the source electrode 133. The first connection electrode 145 is formed on the passivation layer 140 and contacts the source electrode 133 through the first contact hole 143. The gate insulating layer 120, the semiconductor layer 123, the source electrode 133, and the passivation layer 140 is laminated between the first connection electrode 145 and the first substrate 110, and the first connection electrode 145 has a third height h3 from the first substrate 110.

FIG. 7 shows three dummy pixel regions "DP" in the power supply terminal "PST". The dummy TFT "DT" is formed on the first substrate 110 in the dummy pixel region "DP" in the power supply terminal "PST". The dummy TFT "DT" substantially a same laminated structure as the driving TFT "DTr". More particularly, a dummy gate electrode 116, a dummy gate insulating layer 121, a dummy semiconductor layer 124 having a dummy active layer 124a and a dummy ohmic contact layer 124b, dummy source and dummy drain electrodes 134 and 137, and a dummy passivation layer 141 is sequentially formed on the first substrate 110. The dummy gate electrode 116 is formed on the first substrate 110 and has a patterned shape as same as the gate electrode 115 of the driving TFT "DTr". The dummy gate insulating layer 121 is formed on the dummy gate electrode 116 such that the dummy gate insulating layer 121 has a step difference. The dummy ohmic contact layer 124b exposes the dummy active layer 124a like as the driving TFT "DTr", and the dummy source electrode 134 and the dummy drain electrode 137 are separated from each other. The semiconductor layer 124, the dummy source electrode 134 and the dummy drain electrode 137 also have a step difference. The dummy passivation layer 141 has a second contact hole 144 exposing one of the dummy source electrode 134 and the dummy drain electrode 137.

A second connection electrode 150 is formed of the same metal as the first connection electrode 145 on the dummy passivation layer 141 such that the connection electrode 150 contacts one of the dummy source electrode 134 and the dummy drain electrode 137. The second connection electrode 150 is connected to the power supply pad 151 (shown in FIG. 5). The first and second connection electrodes 145 and 150 include a transparent material. The transparent material may be one of indium-tin-oxide (ITO), indium-zinc-oxide (IZO), and indium-tin-zinc-oxide (ITZO). There is a difference between the first connection electrode 145 and the second connection electrode 150. The first connection electrode 145 is formed in each pixel region "P", but the second connection electrode 150 is formed on the entire surface of the power supply terminal "PST" such that the second connection electrode 150 is connected to the power supply pad 151 (shown in FIG. 5) in the gate pad area "GPA" or the data pad area "DPA". Except for the difference between the first and second connection electrodes 145 and 150, there is no difference between the structure of the driving TFT "DTr" and the structure of the dummy TFT "DT". Since the laminated layers of the driving TFT "DTr" and the dummy TFT "DT" have the same step difference, and the first connection electrode 145 and the second connection electrode 150 are formed on the uppermost layer of the driving TFT "DTr" and the dummy TFT "DT", respectively, the first and second connection electrodes 145 and 150 has a same height from the first substrate 110. In other words, the step height h3 shown in FIG. 6 is substantially equal to the step height h4 shown in FIG. 7

Next, a laminated structure of the second substrate 160 is described by FIGS. 6 and 7. The second substrate 160 includes first and second electrode 163 and 180, a organic luminescent layer 176, a buffer pattern 166, first and second spacers 170 and 173, a third connection electrode 183 and a fourth connection electrode 186. The first electrode 163 is formed of a transparent material on entire surface of the second substrate 160, and the buffer layer 166 is formed on the first electrode 163 at boundaries of each array device area "ADA" and each dummy pixel region "DP". The transparent material may be ITO. Though not shown in FIG. 6, the buffer pattern may be formed at boundary of each pixel region, and a party wall is formed on the buffer pattern. The first spacer 170 is formed on the buffer pattern 166 in the array device area "ADA", and the second spacer 173 is formed on the buffer pattern 166 in the dummy pixel region "DP". The second spacer 173 has substantially a same height and a same width as the first spacer 170. Unlike the second spacer 73 of the related art, the second spacer 173 of the present invention has a same shape as the first spacer 170.

The organic luminescent layer 176 is formed on each pixel region "P" of the display region "DA" and each dummy pixel region "DP". The organic luminescent layer 176 is formed on the first and second spacers 170 and 173, but it is not essential. Though not shown in FIGS. 6 and 7, a first organic material layer and a second organic material layer are formed on upper and lower sides of the organic luminescent layer 176, respectively. Functions of the first organic material layer and the second organic material layer depend on the first and second electrodes 163 and 180. When the first electrode 163 is a cathode, and the second electrode 180 is an anode, the first organic material layer functions as an electron injecting layer and an electron transporting layer, and the second organic layer functions as a hole injecting layer and a hole transporting layer. Contrarily, when the first electrode 163 is the anode, and the second electrode 180 is the cathode, the first organic material layer functions as the hole injecting layer and the hole transporting layer, and the second organic layer functions as the electron injecting layer and the electron transporting layer. The first and second organic material layers are formed to increase a luminescent efficiency. The first and second organic material layers are not essential.

The second electrode 180 is formed on the organic luminescent layer 176. The second electrode 180 is formed on each pixel region between the buffer patterns 166. The second electrode 180 extends to the first spacer 170 such that covers the first spacer 170 and the organic luminescent layer 176 on the first spacer 170. The second electrode 180 covering the first spacer 170 and the organic luminescent layer 176 is defined as the third connection electrode 183. The second electrode 180 in the dummy pixel region "DP" is formed on the organic luminescent layer 176 and extends to cover the second spacer 173 and the organic luminescent layer 176 on the second spacer 173. The second electrode 180 covering the second spacer 173 and the organic luminescent layer 176 is defined as the fourth connection electrode 186. The third connection electrode 183 corresponds to the first connection electrode 145 in the array device area "ADA" on the first substrate 110, and the fourth electrode 186 corresponds to the second connection electrode 150 in the dummy pixel region "DP" on the first substrate 110. Since the buffer pattern 166, the first spacer 170 and the organic luminescent layer 176 is laminated between the second substrate 160 and the third connection electrode 183, and the buffer pattern 166, the second spacer 173 and the organic luminescent layer 176 is laminated between the second substrate 160 and the fourth connection electrode 186, the third connection electrode 183 and the fourth connection electrode 186 have a same height as each other.

The first and second substrates 110 and 160 face each other and are attached by using the seal pattern 190 (shown in FIG. 5) such that the third connection electrode 183 on the second substrate 160 contacts the first connection electrode 145 on the first substrate 110, and the fourth connection electrode on the second substrate 160 contacts the second connection electrode 150 on the first substrate 110. Since the first and second connection electrodes 145 and 150 have the same height, and the third and fourth connection electrodes 183 and 186 have a same height, a gap difference between the first and second substrate 110 and 160 does not occur.

What is claimed is:

1. A dual panel type organic electroluminescent display device, comprising:
    first and second substrates facing each other;
    a plurality of gate lines and a plurality of data lines on the first substrate including a display region, where a plurality of pixel regions are defined, and a non-display region, where a plurality of dummy pixel regions are defined, surrounding the display region, wherein two outmost gate lines and two outmost data lines, which cross the two outmost gate lines, surround the display region;
    a first thin film transistor (TFT) positioned in each pixel region and on the first substrate, the first TFT connected to one of the plurality of gate lines and one of the plurality of data lines; and
    a first connection electrode on and contacting the first TFT;
    a second TFT positioned in each dummy pixel region and having substantially the same structure as the first TFT;
    a second connection electrode covering the second TFT;
    a first electrode on an entire surface of the second substrate;
    a plurality of first buffer patterns on the first electrode in boundaries of the plurality of pixel regions and the plurality of dummy pixel regions;
    a plurality of first spacers on the plurality of first buffer pattern;
    an organic luminescent layer on the first electrode;
    a second electrode on organic luminescent layer; and
    a third connection electrode extending from the second electrode and covering the plurality of first spacer,
    wherein the first electrode, the second electrode and the organic luminescent layer between the first and second electrodes comprises an organic luminescent diode, and wherein the third connection electrode in the each pixel region contacts the first connection electrode in the first substrate and the third connection electrode in the each dummy pixel region contacts the second connection electrode in the first substrate.

2. The dual panel type organic electroluminescent display device according to claim 1, wherein the first and second connection electrodes have substantially the same height relative to the first substrate.

3. The dual panel type organic electroluminescent display device according to claim 1, wherein the first TFT includes a gate electrode, a gate insulating layer on the gate electrode, a semiconductor layer on the gate insulating layer, source and drain electrodes on the semiconductor layer, and a passivation layer on the source and drain electrodes,
    wherein the gate electrode extends from the gate line, the semiconductor layer has a greater width than that of the gate electrode, the source and drain electrodes are separated from each other, and the passivation layer has a contact hole exposing one of the source and drain electrodes,
    wherein the first connection electrode contacts one of the source and drain electrodes through the contact hole,
    wherein the second TFT includes a dummy gate electrode, a dummy gate insulating layer on the dummy gate electrode, a dummy semiconductor layer on the dummy gate insulating layer, a dummy source electrode and a dummy drain electrode on the semiconductor layer, and a dummy passivation layer on the dummy source electrode and dummy drain electrode, and
    wherein the dummy semiconductor layer has a greater width than the dummy gate electrode.

4. The dual panel type organic electroluminescent display device according to claim 1, wherein the dummy source electrode is separated from the dummy drain electrode and the dummy passivation layer has a dummy contact hole exposing one of the dummy source electrode and the dummy drain electrode, and wherein the second connection electrode contacts one of the dummy source electrode and the dummy drain electrode through the dummy contact hole.

5. The dual panel type organic electroluminescent display device according to claim 1, wherein the first and second connection electrodes comprise a transparent conductive material.

6. The dual panel type organic electroluminescent display device according to claim 5, wherein the transparent conductive material comprises one of ITO, IZO or ITZO.

7. The dual panel type organic electroluminescent display device according to claim 1 further comprising:
- a gate pad area including a gate pad in an outer region of the pixel region on the first substrate, which is connected to the gate line; and
- a data pad area including a data pad in an outer region of the pixel region on the first substrate, which is connected to the data line.

8. The dual panel type organic electroluminescent display device according to claim 7 further comprising power supply pads connected to the dummy TFT in the gate pad area and the data pad area.

9. The dual panel type organic electroluminescent display device according to claim 1 further comprising a seal pattern attaching the first and second substrates.

10. A dual panel type organic electroluminescent display device, comprising:
- a first substrate including a display region, where a plurality of pixel regions are defined, and a non-display region, where a plurality of dummy pixel regions are defined, surrounding the display region,
- a plurality of gate lines and a plurality of data lines on the first substrate, wherein two outmost gate lines and two outmost data lines, which cross the two outmost gate lines, surround the display region;
- a first thin film transistor (TFT) positioned in each pixel region and on the first substrate, the first TFT connected to one of the plurality of gate lines and one of the plurality of data lines;
- a first electrode on the first TFT;
- a second TFT positioned in the dummy pixel region and having substantially the same structure as the first TFT;
- a second electrode on the second TFT;
- a first electrode on an entire surface of the second substrate;
- an organic luminescent layer on the first electrode; and
- a second electrode on organic luminescent layer, the second electrode in one of the plurality of pixel regions being separated from the second electrode in another one of the plurality of pixel region, the second electrode in one of the plurality of dummy pixel regions being continuous with the second electrode in another one of the plurality of dummy pixel regions,
- wherein the first electrode has a first height relative to the first substrate, and the second electrode has a second height, which is substantially equal to the first height, relative to the first substrate.

11. The dual panel type organic electroluminescent display device according to claim 10, wherein each of the first and second TFTs includes a gate electrode, a gate insulating layer on the gate electrode, a semiconductor layer on the gate insulating layer, source and drain electrodes on the semiconductor layer, and a passivation layer on the source and drain electrodes, and a first electrode contacting one of the source and drain electrode.

* * * * *